US010269869B1

(12) United States Patent
Ando et al.

(10) Patent No.: US 10,269,869 B1
(45) Date of Patent: Apr. 23, 2019

(54) HIGH-DENSITY FIELD-ENHANCED RERAM INTEGRATED WITH VERTICAL TRANSISTORS

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/827,691

(22) Filed: Nov. 30, 2017

(51) Int. Cl.
H01L 29/66 (2006.01)
H01L 27/24 (2006.01)
H01L 45/00 (2006.01)
H01L 29/49 (2006.01)

(52) U.S. Cl.
CPC ...... H01L 27/2454 (2013.01); H01L 29/4966 (2013.01); H01L 29/66545 (2013.01); H01L 45/08 (2013.01); H01L 45/145 (2013.01); H01L 45/146 (2013.01); H01L 45/1616 (2013.01)

(58) Field of Classification Search
CPC ............. H01L 27/2454; H01L 29/4966; H01L 29/66545; H01L 45/08; H01L 45/145; H01L 45/146; H01L 45/1616
USPC ........................................................ 257/329
See application file for complete search history.

(56) References Cited

U.S. PATENT DOCUMENTS

| 7,355,886 B1* | 4/2008 | Cai .................... G11C 13/0007 365/158 |
| 9,076,523 B2 | 7/2015 | Lee et al. |
| 9,331,088 B2 | 5/2016 | Takaki |
| 9,343,507 B2 | 5/2016 | Takaki |
| 9,691,819 B2 | 6/2017 | Oh et al. |
| 2013/0161583 A1 | 6/2013 | Blomme et al. |
| 2014/0117303 A1* | 5/2014 | Wang .................... H01L 45/145 257/4 |
| 2017/0162559 A1* | 6/2017 | Lesenco ............. H01L 27/0623 |

* cited by examiner

Primary Examiner — Tu-Tu V Ho
(74) Attorney, Agent, or Firm — Tutunjian & Bitetto, P.C.; Vazken Alexanian

(57) ABSTRACT

A method is presented for integrating a resistive random access memory (ReRAM) device with vertical transistors on a single chip. The method includes forming a vertical field effect transistor (FET) including an epitaxial tip defining a drain terminal and forming the ReRAM device in direct contact with the epitaxial tip of the vertical FET such that a current conducting filament is formed at the epitaxial tip due to electric field enhancement.

19 Claims, 10 Drawing Sheets

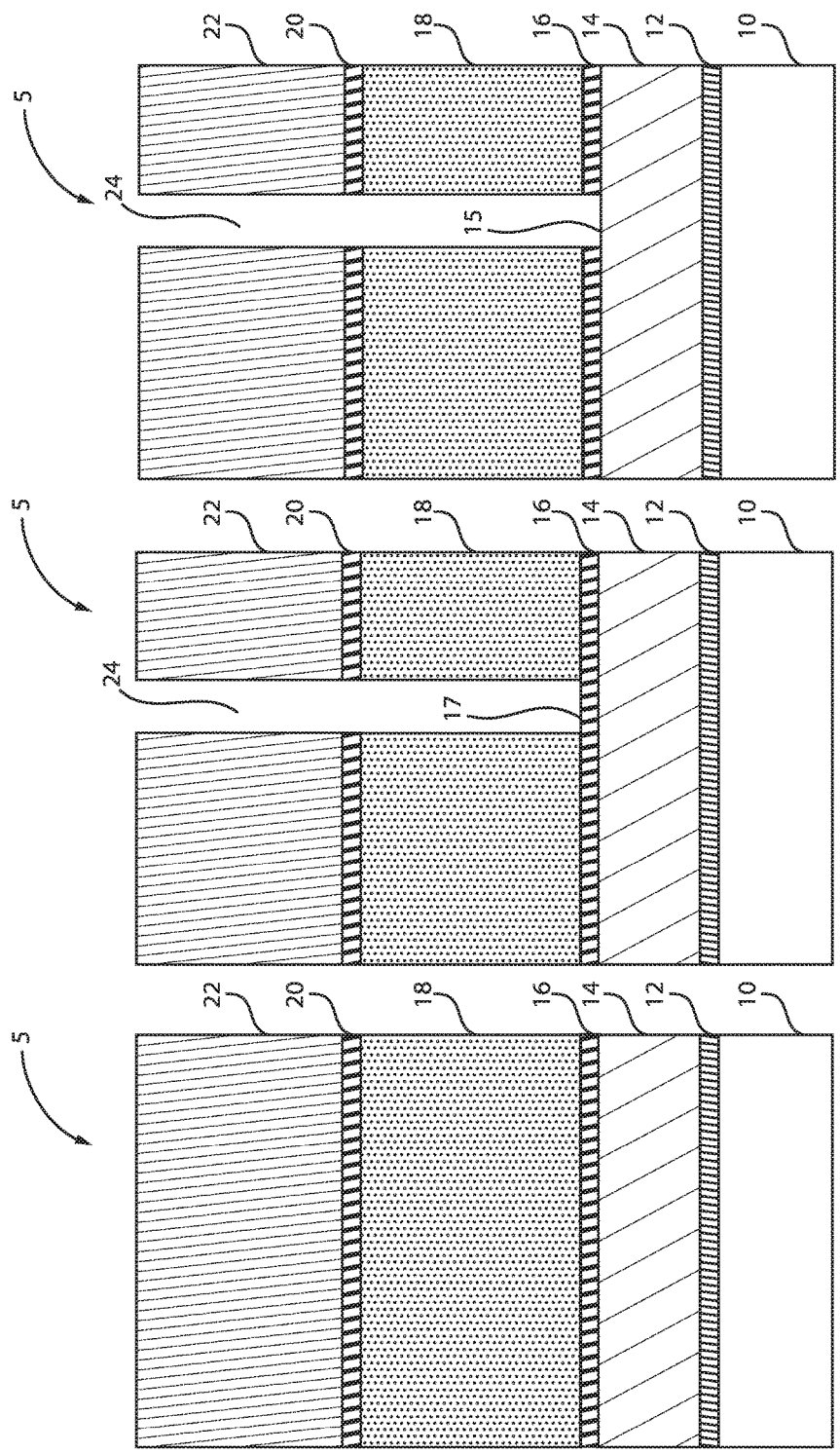

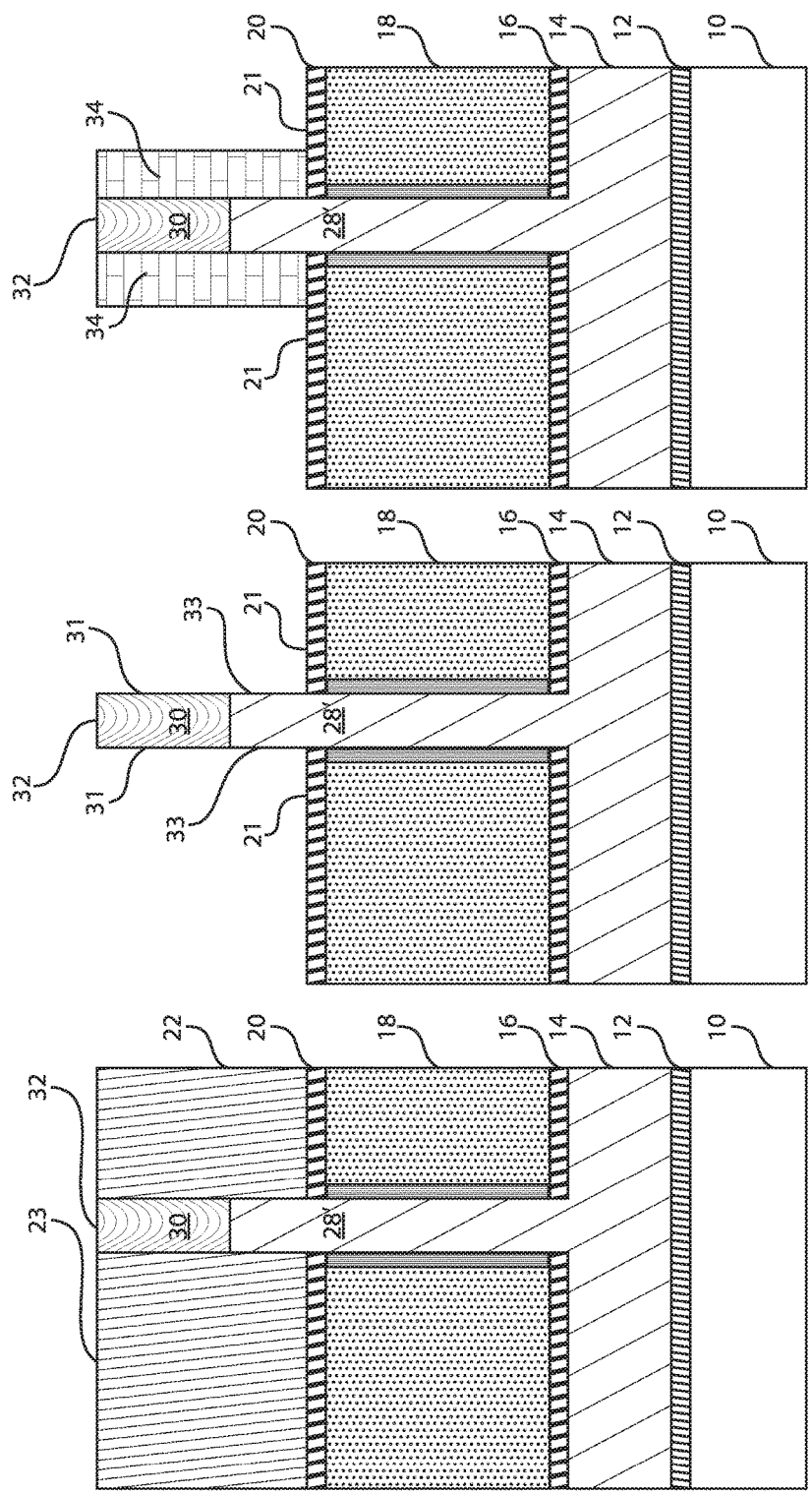

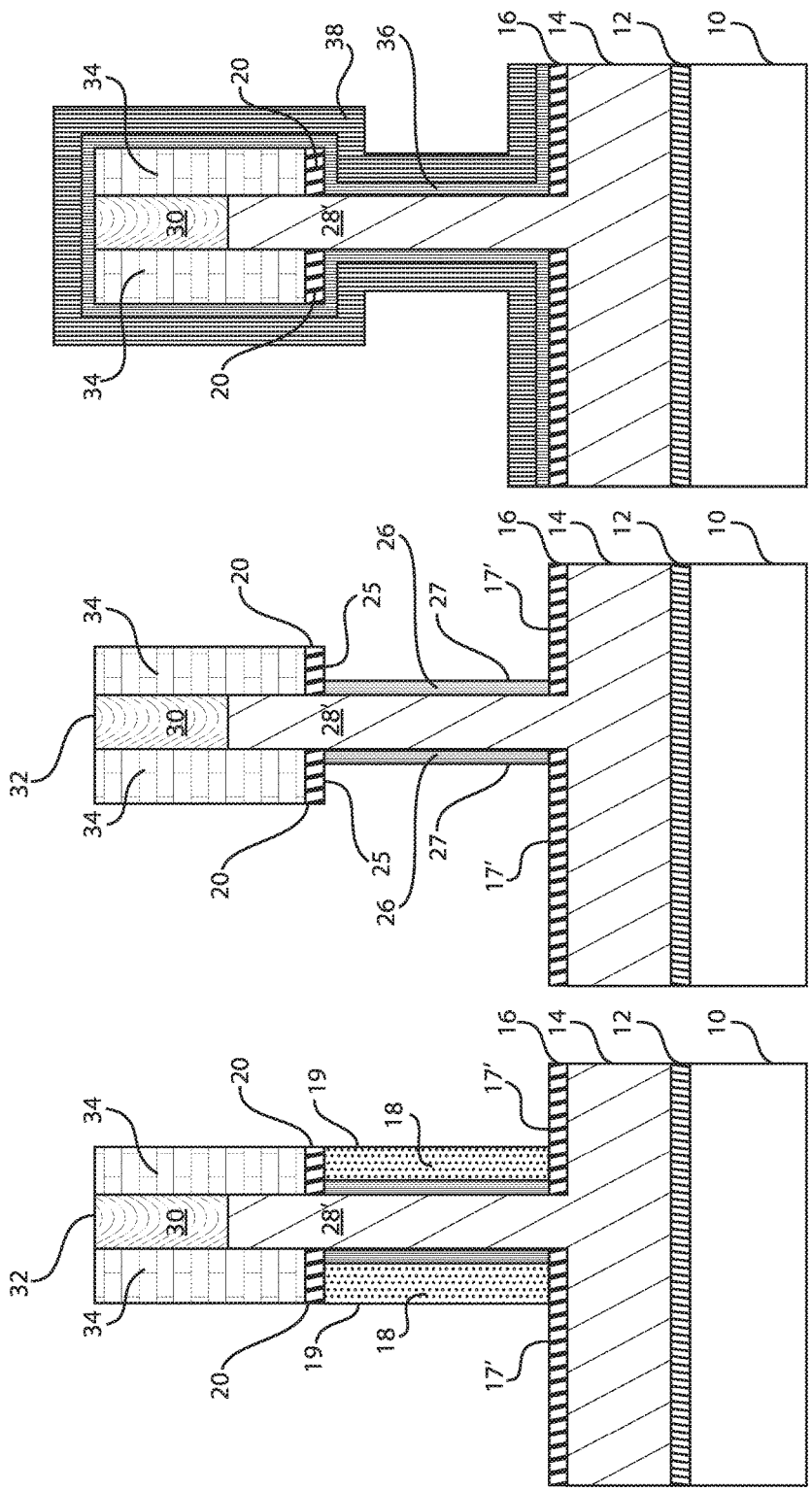

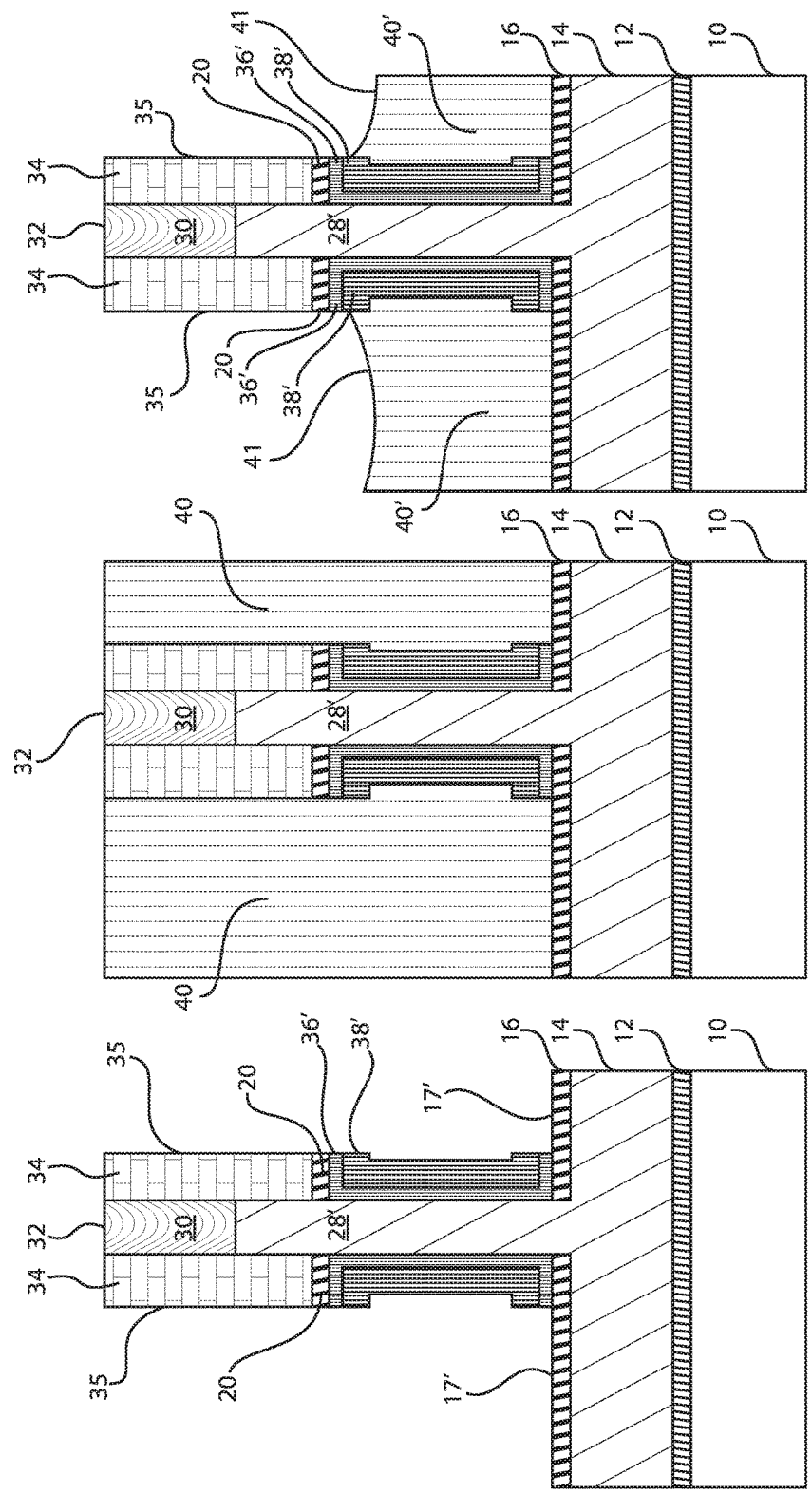

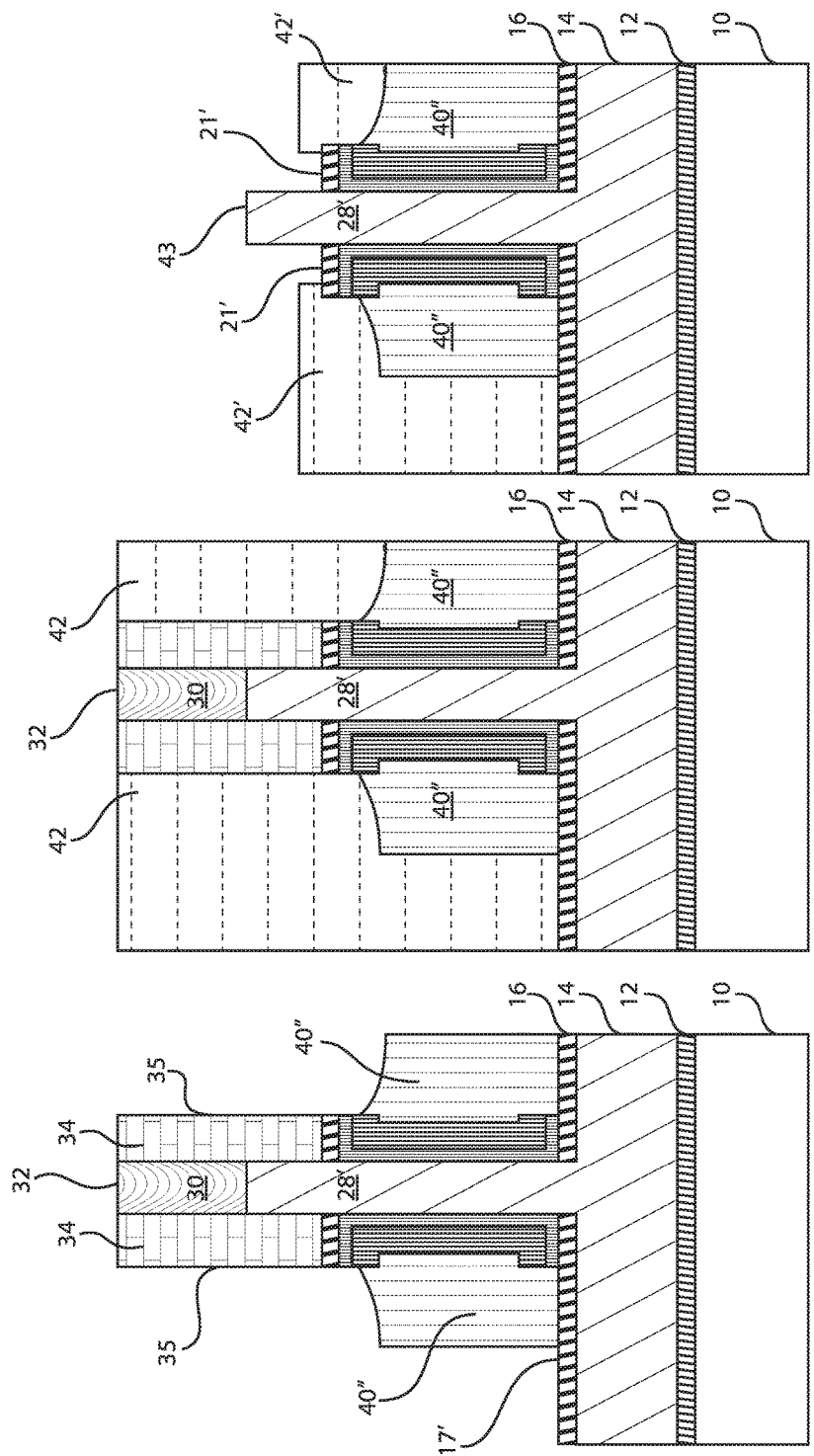

HIGH-DENSITY FIELD-ENHANCED RERAM INTEGRATED WITH VERTICAL TRANSISTORS

BACKGROUND

Technical Field

The present invention relates generally to semiconductor devices, and more specifically, to vertical restive random access memory (ReRAM) devices.

Description of the Related Art

One example of non-volatile memory uses variable resistance memory elements that can be set to either low or high resistance states, and can remain in that state until subsequently reset to an initial condition. The variable resistance memory elements are individually connected between two orthogonally extending conductors (e.g., bit and word lines) where they cross each other in a two-dimensional array. The state of such a memory element is usually changed by proper voltages being placed on the intersecting conductors.

SUMMARY

In accordance with an embodiment, a method is provided for integrating a resistive memory element with vertical transistors on a single chip. The method includes forming a dummy gate between a first spacer and a second spacer, etching the first spacer, the dummy gate, and the second spacer to form a recess, filling the recess with an epitaxial material, and recessing the epitaxial material to form a hardmask thereon. The method further includes forming spacers adjacent the hardmask and a top section of the epitaxial material, removing the dummy gate to expose a bottom section of the epitaxial material, forming a high-k-metal gate (HKMG) in direct contact with the bottom section of the epitaxial material, and forming a metal gate in direct contact with the HKMG. The method also includes removing the spacers and the hardmask to expose a top section of the epitaxial material, forming an epitaxial growth over the epitaxial material, and integrating the resistive memory element with the epitaxial growth.

In accordance with an embodiment, a method is provided for integrating a resistive memory element with vertical transistors on a single chip. The method includes forming a vertical field effect transistor (FET) including an epitaxial tip defining a drain terminal and forming the ReRAM device in direct contact with the epitaxial tip of the vertical FET such that a current conducting filament is formed at the epitaxial tip due to electric field enhancement.

In accordance with another embodiment, a semiconductor device is provided. The semiconductor device includes a vertical transistor including an epitaxial tip defining a drain terminal and a resistive memory element formed directly on the epitaxial tip of the vertical transistor.

In accordance with another embodiment, a semiconductor device is provided. The semiconductor device includes a dummy gate formed between a first spacer and a second spacer, a recess formed by etching the first spacer, the dummy gate, and the second spacer, an epitaxial material deposited within the recess, a hardmask formed after recessing the epitaxial material, spacers formed adjacent the hardmask and a top section of the epitaxial material, wherein the dummy gate is removed to expose a bottom section of the epitaxial material, a high-k-metal gate (HKMG) formed in direct contact with the bottom section of the epitaxial material, a metal gate formed in direct contact with the HKMG, wherein the spacers and the hardmask are removed to expose a top section of the epitaxial material, and an epitaxial growth formed over the epitaxial material. The resistive memory element is integrated with the epitaxial growth.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including at least an oxide layer, a top spacer, a bottom spacer, and a dummy gate formed between the top and bottom spacers such that all elements are formed over a semiconductor substrate, in accordance with an embodiment of the present invention;

FIG. 2 is a cross-sectional view of the semiconductor structure of FIG. 1 where the oxide layer, the top spacer, and the dummy gate are partially etched to form a recess and expose a top surface of the bottom spacer, in accordance with an embodiment of the present invention;

FIG. 3 is a cross-sectional view of the semiconductor structure of FIG. 2 where the exposed portion of the bottom spacer is selectively etched to expose a top surface of a source contact, in accordance with an embodiment of the present invention;

FIG. 7 is a cross-sectional view of the semiconductor structure of FIG. 6 where a top section of the epitaxial material is removed and a nitride fill takes place (to form a hardmask), in accordance with an embodiment of the present invention;

FIG. 8 is a cross-sectional view of the semiconductor structure of FIG. 7 where the oxide layer is recessed to expose the hardmask, as well as a top portion of the epitaxial material, in accordance with an embodiment of the present invention;

FIG. 9 is a cross-sectional view of the semiconductor structure of FIG. 8 where spacers are formed adjacent the hardmask, in accordance with an embodiment of the present invention;

FIG. 10 is a cross-sectional view of the semiconductor structure of FIG. 9 where sections of the top spacer and dummy gate are removed to expose a top surface of the bottom spacer, in accordance with an embodiment of the present invention;

FIG. 11 is a cross-sectional view of the semiconductor structure of FIG. 10 where the dummy gate is completely removed to expose side surfaces of the thin oxide layers, in accordance with an embodiment of the present invention;

FIG. 12 is a cross-sectional view of the semiconductor structure of FIG. 11 where the thin oxide layers are completely removed and a high-k metal gate (HKMG) is deposited, in accordance with an embodiment of the present invention;

FIG. 13 is a cross-sectional view of the semiconductor structure of FIG. 12 where the HKMG is etched such that a portion of the HKMG remains intact adjacent the epitaxial material, in accordance with an embodiment of the present invention;

FIG. 14 is a cross-sectional view of the semiconductor structure of FIG. 13 where a metal gate is deposited over the semiconductor structure, in accordance with an embodiment of the present invention;

FIG. 15 is a cross-sectional view of the semiconductor structure of FIG. 14 where the metal gate is partially recessed to expose the spacers formed adjacent the hardmask, in accordance with an embodiment of the present invention;

FIG. 16 is a cross-sectional view of the semiconductor structure of FIG. 15 where another portion of the metal gate is partially etched to expose a top surface of the bottom spacer, in accordance with an embodiment of the present invention;

FIG. 17 is a cross-sectional view of the semiconductor structure of FIG. 16 where a first inter-layer dielectric (ILD) is deposited, in accordance with an embodiment of the present invention;

FIG. 18 is a cross-sectional view of the semiconductor structure of FIG. 17 where the spacers and the hardmask are removed to expose a top section of the epitaxial material and a top surface of the top spacer, in accordance with an embodiment of the present invention;

Throughout the drawings, same or similar reference numerals represent the same or similar elements.

DETAILED DESCRIPTION

Figure 4:
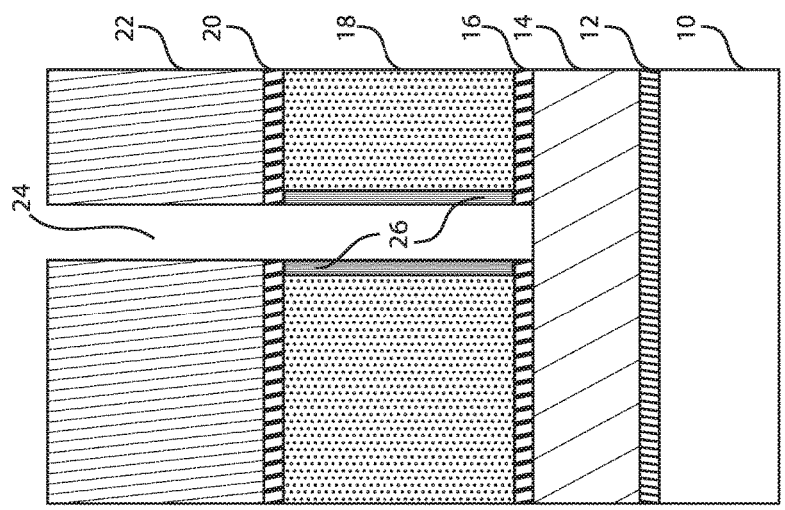
FIG. 4 is a cross-sectional view of the semiconductor structure of FIG. 3 where thin oxide formation takes place on the dummy gate, in accordance with an embodiment of the present invention.

Embodiments in accordance with the present invention provide methods and devices for improving resistive switching memories. With the explosive growth of digital data in the era of Internet of Things (IoT), fast and scalable technologies including resistive switching memories are being explored for data storage and data-driven computation. A resistive switching memory (RRAM or ReRAM) offers high speed, high density, and low cost of fabrication as a result of its two-terminal structure. RRAM devices offer advantages in terms of area occupation, speed, and scaling. A common denominator for RRAM devices is that they are resistive memories where the resistance serves as a probed state variable. The resistance can be changed by electrical pulses according to various physical processes. For example, in an RRAM device, the resistance usually changes according to a state of a conductive filament within an insulating oxide layer. Moreover, the two-terminal structure of RRAM devices can be accommodated in a crosspoint or crossbar array where dense packing of wordlines and bitlines allows for an extremely small bit area. Another advantage of RRAM devices is the ability to independently program and erase each device, as well as the ability to accomplish faster switching, usually in a range of 100 nanoseconds (ns). The short switching time, combined with relatively low-voltage operation also allows for low program and erase energy use for low-power consumption.

Embodiments in accordance with the present invention provide methods and devices for improving resistive switching memories by integrating resistive switching memories with vertical transistors. In particular, a vertical field effect transistor (FET) is formed that includes an epitaxial tip defining a drain terminal. Then, a ReRAM device is formed in direct contact with the epitaxial tip of the vertical FET such that a current conducting filament is formed at the epitaxial tip due to electric field enhancement. Thus, the memory cell is integrated on a drain (or top) side of a vertical transistor. The enhanced electric field aids in lowering a set voltage and reset current of the high-k based ReRAM. Moreover, the vertical FET and the oxide ReRAM are connected in series to form a one transistor-one resistor (1T1R) configuration.

Resistive random access memory (RRAM) is considered a promising technology for electronic synapse devices or memristor devices for neuromorphic computing, as well as high-density and high-speed non-volatile memory applications. In neuromorphic computing applications, a resistive memory device can be used as a connection (synapse) between a pre-neuron and a post-neuron, representing connection weight in the form of device resistance. Multiple pre-neurons and post-neurons can be connected through a crossbar or crosspoint array of RRAMs, which naturally expresses a fully-connected neural network. Resistive memories are promising not only for nonvolatile memories, but also for computing memories, thus allowing for fast data access and for computing architectures blurring a distinction between memory and computing circuits, such as nonvolatile memristive logic computation or neuromorphic networks.

Among the emerging memory technologies, RRAM is one of the most promising devices given its good cycling endurance, high speed, ease of fabrication and good scaling behavior. One of the most significant strengths of RRAM against phase change memory (PCM) and spin-transfer torque memories (STTRAM) is its simple structure, including only an insulating layer inserted between two or more metallic layers. Also, current consumption in RRAM is low because of filamentary conduction, whereas a programming current in PCM and STTRAM is proportional to a device area.

Given this strong potential, large scale RRAM devices are presented herein using a crossbar architecture. RRAM has also been demonstrated with a relatively small scale, aimed at embedded memory applications in the automotive industry, smart cards, and smart sensors for Internet of Things (IoT) markets. Embedded RRAM provides advantages over flash memory, such as lower energy consumption and higher speed. On the other hand, crossbar RRAM offers a higher density compared to DRAM and a higher speed compared to flash memory, in addition to nonvolatile behavior and 3D integration. The exemplary embodiments of the present invention achieve such results by integrating high-density field-enhanced ReRAM with vertical transistors.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including at least an oxide layer, a top spacer, a bottom spacer, and a dummy gate formed between the top and bottom spacers such that all elements are formed over a semiconductor substrate, in accordance with an embodiment of the present invention.

A semiconductor structure 5 includes a semiconductor substrate 10. A counter-doped layer 12 is formed over the substrate 10. A source region 14 is formed over the counter-doped layer 12. A bottom spacer 16 is formed over the source region 14. A dummy gate 18 is formed over the bottom spacer 16. The dummy gate 18 can be, e.g., an amorphous silicon layer. A top spacer 20 is then formed over the dummy gate 18. A dielectric layer 22 can then be deposited over the top spacer 20. The dielectric layer 22 can be, e.g., an oxide. The top and bottom spacers 20, 16 can be, e.g., nitride films. In an embodiment, the top and bottom spacers 20, 16 can be an oxide, for example, silicon oxide (SiO), a nitride, for example, a silicon nitride (SiN), or an oxynitride, for example, silicon oxynitride (SiON).

FIG. 2 is a cross-sectional view of the semiconductor structure of FIG. 1 where the oxide layer, the top spacer, and the dummy gate are partially etched to form a recess and expose a top surface of the bottom spacer, in accordance with an embodiment of the present invention.

In various example embodiments, the oxide 22, the top spacer 20, and the dummy gate 18 are partially etched to form a recess 24. A top surface 17 of the bottom spacer 16 is also exposed. The etching can include a dry etching process such as, for example, reactive ion etching, plasma etching, ion etching or laser ablation. The etching can further include a wet chemical etching process in which one or more chemical etchants are used to selectively remove portions of the layers 18, 20, 22.

FIG. 3 is a cross-sectional view of the semiconductor structure of FIG. 2 where the exposed portion of the bottom spacer is selectively etched to expose a top surface of a source contact, in accordance with an embodiment of the present invention.

In various example embodiments, an exposed portion of the bottom spacer 16 is etched to expose a top surface 15 of the source region 14.

FIG. 4 is a cross-sectional view of the semiconductor structure of FIG. 3 where thin oxide formation takes place on the dummy gate, in accordance with an embodiment of the present invention.

In various example embodiments, thin oxide layers 26 are formed on exposed surfaces of the dummy gate 18. The thin oxide layers 26 extend from the bottom spacer 16 to the top spacer 20. The thin oxide layers 26 can be formed by any oxidation techniques known to one skilled in the art.

Figure 5:
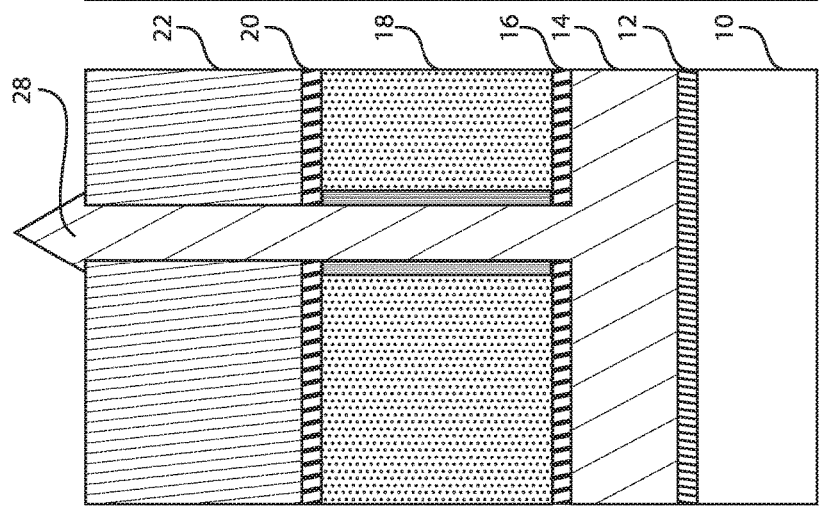
FIG. 5 is a cross-sectional view of the semiconductor structure of FIG. 4 where an epitaxial material is deposited within the recess and adjacent the thin oxide layers formed on the dummy gate, in accordance with an embodiment of the present invention.

FIG. 5 is a cross-sectional view of the semiconductor structure of FIG. 4 where an epitaxial material is deposited within the recess and adjacent the thin oxide layers formed on the dummy gate, in accordance with an embodiment of the present invention.

In various example embodiments, an epitaxial material 28 is formed within the recess or channel 24. The epitaxial material 28 contacts the source region 14, as well as an exposed side surface of the thin oxide layers 26.

Figure 6:
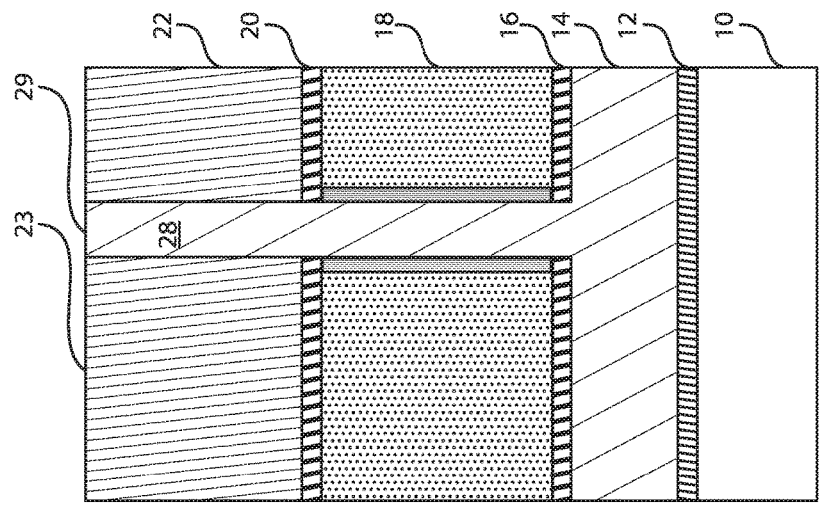
FIG. 6 is a cross-sectional view of the semiconductor structure of FIG. 5 where the epitaxial material is polished by, e.g., chemical-mechanical polishing (CMP) techniques, in accordance with an embodiment of the present invention.

FIG. 6 is a cross-sectional view of the semiconductor structure of FIG. 5 where the epitaxial material is polished by, e.g., chemical-mechanical polishing (CMP) techniques, in accordance with an embodiment of the present invention.

In various example embodiments, the epitaxial material 28 is planarized. The planarization process can be provided by chemical mechanical planarization (CMP). Other planarization processes can include grinding and polishing. Planarization results in a top surface 29 of the epitaxial material 28 being exposed. Also, the top surface 29 of the epitaxial material is substantially flush with a top surface 23 of the oxide layer 22.

FIG. 7 is a cross-sectional view of the semiconductor structure of FIG. 6 where a top section of the epitaxial material is removed and a nitride fill takes place (to form a hardmask), in accordance with an embodiment of the present invention.

In various example embodiments, a top portion of the epitaxial material 28 is recessed and a nitride fill takes place. The nitride fill is performed by deposition of nitride by using e.g., a chemical vapor deposition (CVD) or physical vapor deposition (PVD) process, followed by CMP. The nitride fill results in a hardmask 30 formed over the remaining epitaxial material 28'. The hardmask 30 has a top surface 32 that is flush with the top surface 23 of the oxide layer 22. The hardmask 30 can be formed from, e.g., silicon nitride (SiN).

FIG. 8 is a cross-sectional view of the semiconductor structure of FIG. 7 where the oxide layer is recessed to expose the hardmask, as well as a top portion of the epitaxial material, in accordance with an embodiment of the present invention.

In various example embodiments, the oxide layer 22 is recessed to expose the hardmask 30 and a top section of the epitaxial material 28'. The removal of the oxide layer 22 results in the exposure of side surfaces 31 of the hardmask 30, as well as the exposure of side surfaces 33 of the top section of the epitaxial material 28'. Additionally, a top surface 21 of the top spacer 20 is exposed.

FIG. 9 is a cross-sectional view of the semiconductor structure of FIG. 8 where spacers are formed adjacent the hardmask, in accordance with an embodiment of the present invention.

In various example embodiments, spacers 34 are formed adjacent the hardmask 30, as well as the top section of the epitaxial layer 28'. The spacers 34 extend to the top surface 21 of the top spacer 20. The top surface 32 of the hardmask 30 remains exposed.

FIG. 10 is a cross-sectional view of the semiconductor structure of FIG. 9 where sections of the top spacer and dummy gate are removed to expose a top surface of the bottom spacer, in accordance with an embodiment of the present invention.

In various example embodiments, a portion of the top spacers 20 and a portion of the dummy gate 18 are etched by, e.g., reactive ion etching (RIE) techniques. This results in the exposure of a top surface 17' of the bottom spacer 16. A portion of the top spacers 20 remains between the spacers 34 and the remaining dummy gate 18. The etching further results in side surfaces 19 of the dummy gate 18 being exposed. The spacers 34, the remaining top spacers 20, and the remaining dummy gate 18 are substantially aligned.

FIG. 11 is a cross-sectional view of the semiconductor structure of FIG. 10 where the dummy gate is completely removed to expose side surfaces of the thin oxide layers, in accordance with an embodiment of the present invention.

In various example embodiments, the remaining dummy gate 18 is removed to expose side surfaces 27 of the thin oxide layers 26. If the dummy gate 18 is made of amorphous silicon, then, e.g., tetramethylammonium hydroxide (TMAH) can be used for such selective removal. Additionally, bottom surfaces 25 of the remaining top spacers 20 are also exposed.

FIG. 12 is a cross-sectional view of the semiconductor structure of FIG. 11 where the thin oxide layers are completely removed and a high-k metal gate (HKMG) is deposited, in accordance with an embodiment of the present invention.

In various example embodiments, the think oxide layers 26 are removed and a high-k metal gate (HKMG) 36, 38 is deposited over the structure. The high-k dielectric is designated as 36 and the metal gate is designated as 38. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from about 0.5 to about 3, and each value of y is independently from about 0 to about 2. Exemplary metal gate materials include, but are not limited to, TaN, TiN, TiC, TiAl, TiAlC, W, WN, Ti, and any alloy thereof.

FIG. 13 is a cross-sectional view of the semiconductor structure of FIG. 12 where the HKMG is etched such that a portion of the HKMG remains intact adjacent the epitaxial material, in accordance with an embodiment of the present invention.

In various example embodiments, the HKMG 36, 38 is etched such that remaining HKMG 36', 38' remains only adjacent the epitaxial material 28'. This results in the exposure of side surfaces 35 of spacers 34. Additionally, a top surface 32 of the hardmask 30 is also exposed. Further, a top surface 17' of the bottom spacer 16 is exposed. The remaining HKMG 36', 38' is substantially aligned with the remaining top spacers 20 and the spacers 34.

FIG. 14 is a cross-sectional view of the semiconductor structure of FIG. 13 where a metal gate is deposited over the semiconductor structure, in accordance with an embodiment of the present invention.

In various example embodiments, a metal gate 40 is deposited over the structure. The metal gate 40 encloses or covers the bottom spacer 16 and the remaining HKMG 36', 38', as well as the side surfaces 35 of the spacers 34. The metal gate 40 can be planarized by, e.g., CMP in order that a top surface 32 of hardmask 30 remains exposed. In one example, the metal gate 40 can be tungsten (W), aluminum (Al), doped poly Si, etc.

FIG. 15 is a cross-sectional view of the semiconductor structure of FIG. 14 where the metal gate is partially recessed to expose the spacers formed adjacent the hardmask, in accordance with an embodiment of the present invention.

In various example embodiments, the metal gate 40 is recessed. The remaining metal gate 40' contacts the entire side surfaces of the HKMG 36', 38'. A top surface of the remaining metal gate 40' is designated as 41. Also, the recessing of metal gate 40 results in exposure of side surfaces 35 of spacers 34 and side surfaces of top contacts 20.

FIG. 16 is a cross-sectional view of the semiconductor structure of FIG. 15 where another portion of the metal gate is partially etched to expose a top surface of the bottom spacer, in accordance with an embodiment of the present invention.

In various example embodiments, the metal gate 40' is further recessed such that metal gate section 40" remains. Metal gate section 40" still contacts the side surfaces of the HKMG 36', 38'. The further recessing of metal gate 40' results in the exposure of a portion of top surface 17' of bottom spacer 16.

FIG. 17 is a cross-sectional view of the semiconductor structure of FIG. 16 where a first inter-layer dielectric (ILD) is deposited, in accordance with an embodiment of the present invention.

In various example embodiments, a first dielectric layer 42 is deposited. The first dielectric layer 42 can be an inter-layer dielectric (ILD). In various embodiments, a height of the dielectric layer 42 can be reduced by chemical-mechanical polishing (CMP) and/or etching. Other suitable dielectric materials for forming the ILD include but are not limited to, silicon oxide, silicon nitride, silicon oxynitride, SiCO, SiCON, or any suitable combination of such materials.

FIG. 18 is a cross-sectional view of the semiconductor structure of FIG. 17 where the spacers and the hardmask are removed to expose a top section of the epitaxial material and a top surface of the top spacer, in accordance with an embodiment of the present invention.

In various example embodiments, the ILD 42 is etched, the hardmask 30 is removed, and the spacers 34 are removed. This results in the exposure of top surface 43 of the epitaxial material 28', as well as top surfaces 21' of top spacers 20. Moreover, the remaining ILD is designated as 42'. The remaining ILD 42' covers the metal gate section 40". This structure can be referred to as a vertical field effect transistor (FET).

The etching can include a dry etching process such as, for example, reactive ion etching (RIE), plasma etching, ion etching or laser ablation. The etching can further include a wet chemical etching process in which one or more chemical etchants are used to selectively remove portions of the layers or materials 30, 34.

Figure 19:
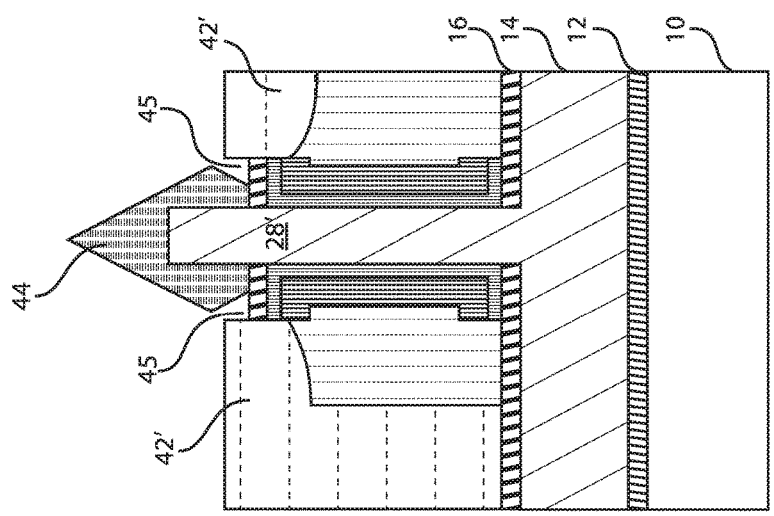
FIG. 19 is a cross-sectional view of the semiconductor structure of FIG. 18 where epitaxial growth takes place on the exposed epitaxial material to form a drain contact, in accordance with an embodiment of the present invention.

FIG. 19 is a cross-sectional view of the semiconductor structure of FIG. 18 where epitaxial growth takes place on the exposed epitaxial material to form a drain contact, in accordance with an embodiment of the present invention.

In various example embodiments, an epitaxial growth of material 44 takes place. Gap regions 45 still remain between the epitaxial growth 44 and the ILD 42'. The epitaxial growth 44 can be referred to as a drain contact or drain region or drain terminal 44 formed over or on the vertical FET of FIG. 18.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth.

The epitaxial material 44 can be doped with an n-type or p-type dopant to provide the conductivity type of the source and drain regions of the transistor. The epitaxial material 44 can be in-situ doped. By "in-situ" it is meant that the dopant that dictates the conductivity type, i.e., n-type or p-type, of the source and drain regions is introduced during the process step that forms the material layer for the source and drain regions, e.g., epitaxial material 44. An in-situ doped epitaxial material 44 having a p-type conductivity can be produced in a type IV semiconductor, such as a silicon including semiconductor or a germanium including semiconductor, by doping the type IV semiconductor material with group III-V elements of the periodic table of elements, such as boron (B). An in-situ doped epitaxial material 44 having an n-type conductivity may be produced in a type IV semiconductor, such as a silicon including semiconductor or a germanium including semiconductor, by doping the type IV semiconductor material with group V elements of the periodic table of elements, such as phosphorus (P) or arsenic (As). In some embodiments, uniform concentration of n-type or p-type dopant that is present in the in-situ doped epitaxial material 44 can range from $1 \times 10^{20}$ atoms/$cm^3$ to $2 \times 10^{21}$ atoms/$cm^3$. In another embodiment, the concentration of n-type or p-type dopant that is present in the in-situ doped epitaxial material 44 can range from $1 \times 10^{20}$ atoms/$cm^3$ to $1 \times 10^{21}$ atoms/$cm^3$.

Figure 20:
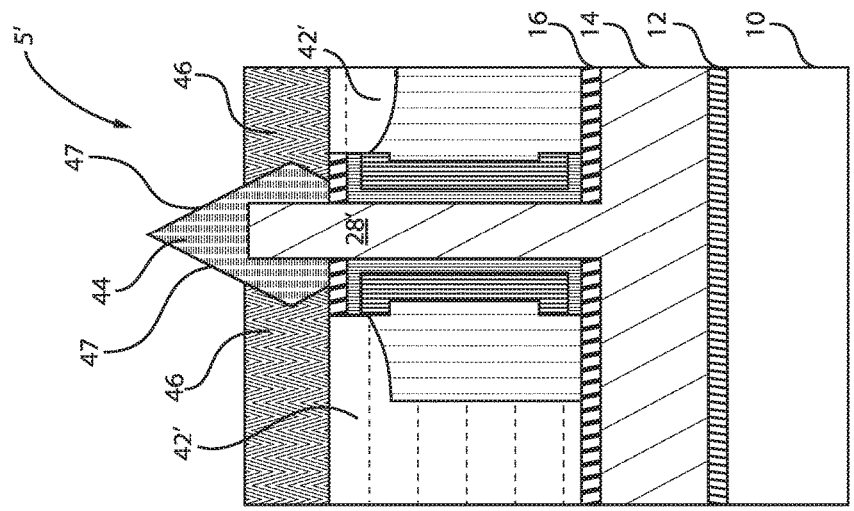
FIG. 20 is a cross-sectional view of the semiconductor structure of FIG. 19 where a second layer of ILD is deposited such that the ILD covers a portion of the epitaxial growth, in accordance with an embodiment of the present invention.

FIG. 20 is a cross-sectional view of the semiconductor structure of FIG. 19 where a second layer of ILD is deposited such that the ILD covers a portion of the epitaxial growth, in accordance with an embodiment of the present invention.

In various example embodiments, a second dielectric layer 46 is deposited over the structurer 5'. The second dielectric layer 42 can be an inter-layer dielectric (ILD). ILD 46 is then polished by CMP and recessed by wet etch to cover part of a drain epitaxial tip 44. The second dielectric layer 46 covers a bottom or proximal portion of the epitaxial growth 44. A tip or distal section 47 of the epitaxial growth 44 remains intact.

Figure 21:
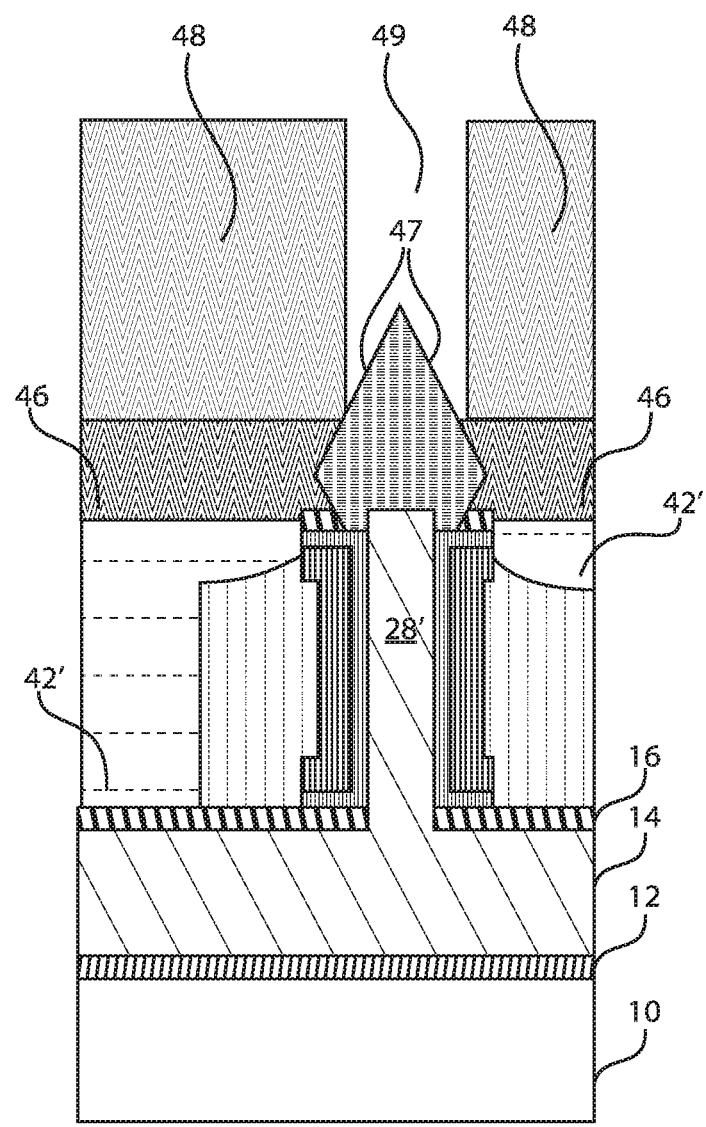
FIG. 21 is a cross-sectional view of the semiconductor structure of FIG. 20 where a third layer of ILD is deposited to cover the epitaxial growth and a recess is formed to expose a top section of the epitaxial growth, in accordance with an embodiment of the present invention.

FIG. 21 is a cross-sectional view of the semiconductor structure of FIG. 20 where a third layer of ILD is deposited to cover the epitaxial growth and a recess is formed to expose a top section of the epitaxial growth, in accordance with an embodiment of the present invention.

In various example embodiments, a third dielectric layer 48 is deposited over the structure 5', after a CMP takes place. The third dielectric layer 48 can be an inter-layer dielectric (ILD). The third dielectric layer 48 initially covers the entire epitaxial growth 44. A recess 49 is then formed through the third dielectric layer 48 to expose the tip or distal section 47 of the drain contact 44.

Figure 22:
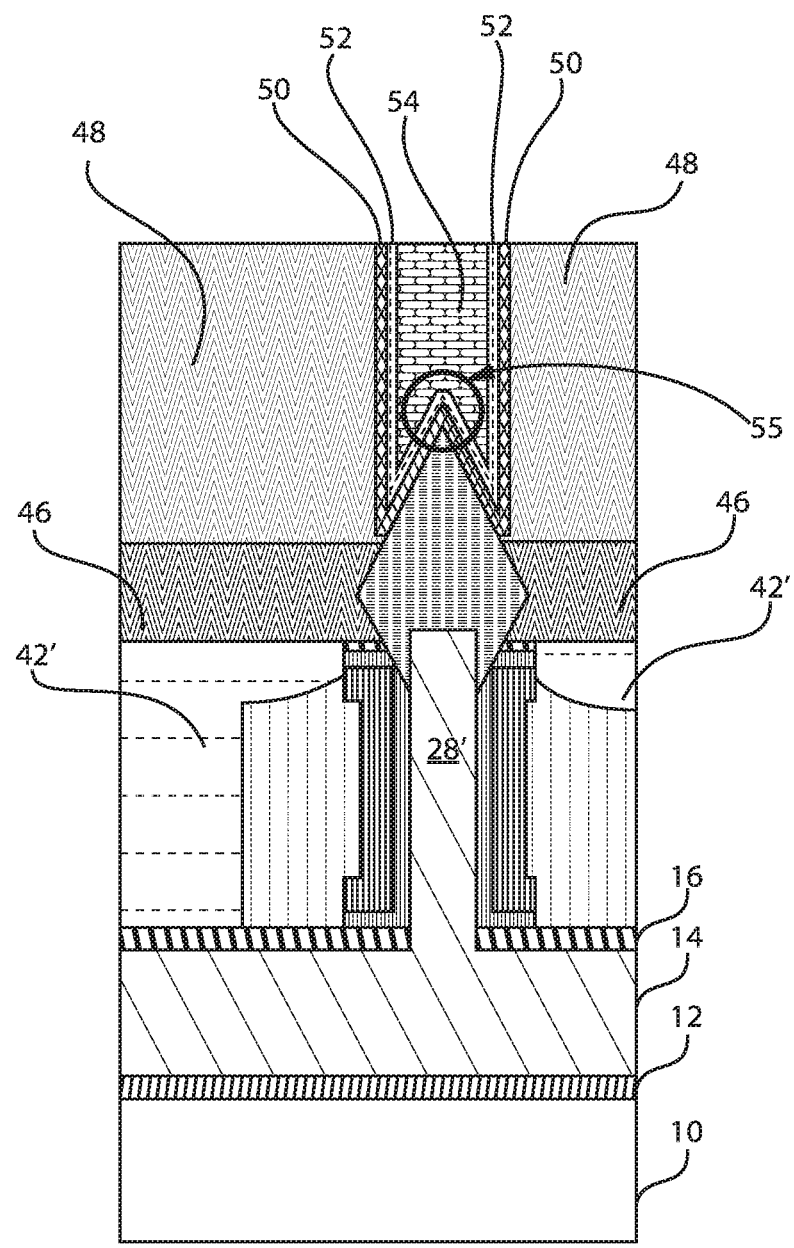
FIG. 22 is a cross-sectional view of the semiconductor structure of FIG. 21 where a restive random access memory (ReRAM) stack is formed over the epitaxial growth, in accordance with an embodiment of the present invention.

FIG. 22 is a cross-sectional view of the semiconductor structure of FIG. 21 where a restive random access memory (ReRAM) stack is formed over the epitaxial growth, in accordance with an embodiment of the present invention.

In various example embodiments, a resistive memory element is formed over the drain contact 44 of the vertical FET. The resistive memory element can be a ReRAM. The ReRAM can include a first layer 50, a second layer 52, and a metal fill 54. The first layer 50 can be, e.g., a hafnium oxide (HfOx) layer or a tantalum oxide (TaOx) layer or a titanium oxide (TiOx) layer. The second layer 52 can be, e.g., a titanium nitride (TiN) layer or a TiN/aluminum-containing alloy layer (e.g., TiN/TiAlC). The metal fill 54 can be, e.g., tungsten (W). A current conducting filament is formed at region 55 due to electric field enhancement. The electric field enhancement lowers a set voltage and a reset current. Moreover, the memory cell is integrated on the drain (top) side of the vertical transistor. The epitaxial tip of the drain terminal of the vertical transistor or nanowire or fin thus provides an enhanced electric field in the memory cell. The vertical transistor and the oxide memory cell (or ReRAM) are connected in series.

Figure 23:
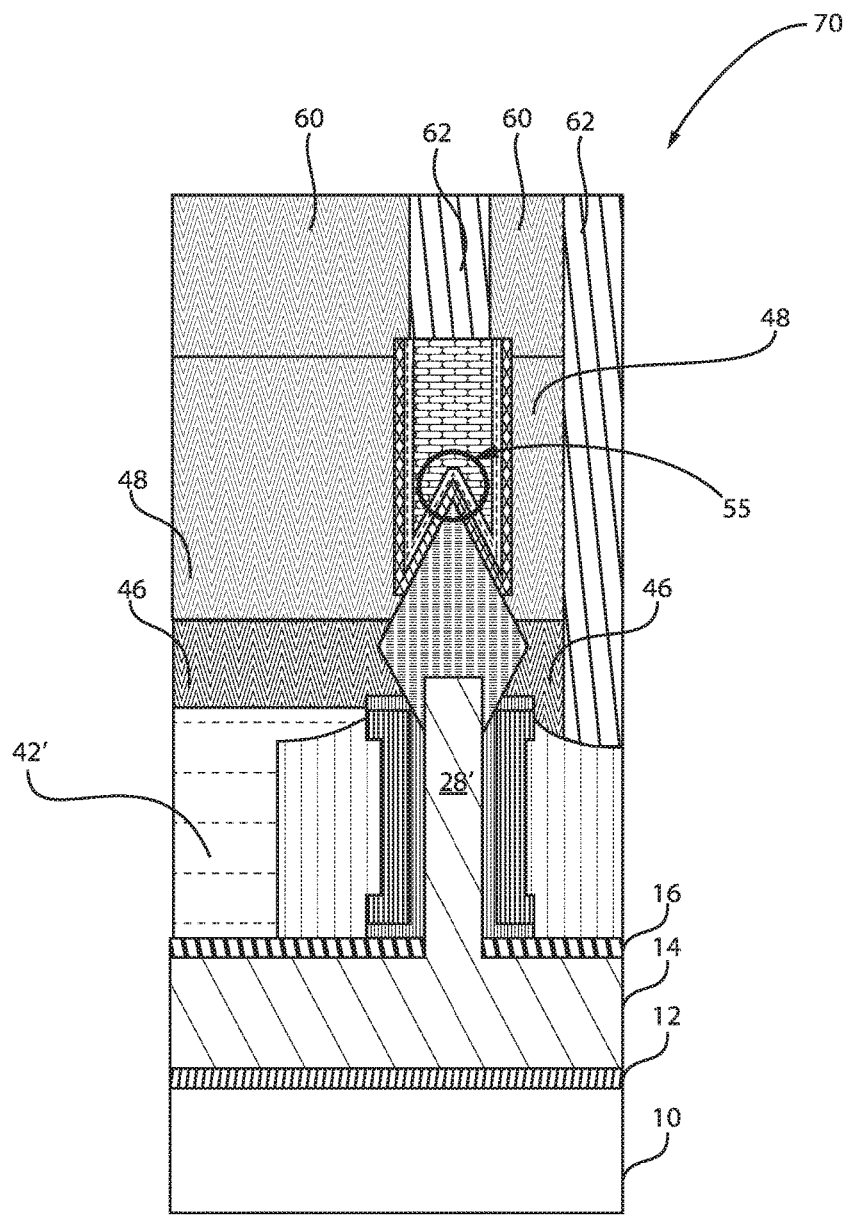
FIG. 23 is a cross-sectional view of the semiconductor structure of FIG. 22 where contacts are formed, in accordance with an embodiment of the present invention.

FIG. 23 is a cross-sectional view of the semiconductor structure of FIG. 22 where contacts are formed, in accordance with an embodiment of the present invention.

In various example embodiments, another ILD layer 60 is deposited and contacts 62 are formed to complete the structure 70 where the memory cell or ReRAM is integrated with an epitaxial tip of drain contact or drain terminal of a vertical transistor.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for integrating high-density field-enhanced ReRAM with vertical transistors (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for integrating a resistive memory element with vertical transistors on a single chip, the method comprising:

forming a dummy gate between a first spacer and a second spacer;

etching the first spacer, the dummy gate, and the second spacer to form a recess;

filling the recess with an epitaxial material;

recessing the epitaxial material to form a hardmask thereon;

forming spacers adjacent the hardmask and a top section of the epitaxial material;

removing the dummy gate to expose a bottom section of the epitaxial material;

forming a high-k-metal gate (HKMG) in direct contact with the bottom section of the epitaxial material;

forming a metal gate in direct contact with the HKMG;

removing the spacers and the hardmask to expose a top section of the epitaxial material;

forming an epitaxial growth over the epitaxial material; and integrating the resistive memory element with the epitaxial growth.

2. The method of claim 1, wherein the resistive memory element includes a resistive random access memory (ReRAM).

3. The method of claim 1, wherein a current conducting filament is formed at a tip of the epitaxial growth due to electric field enhancement.

4. The method of claim 1, wherein a source contact is formed between the second spacer and a semiconductor substrate.

5. The method of claim 1, wherein the epitaxial growth forms a drain contact in contact with the resistive memory element.

6. The method of claim 1, wherein sacrificial oxide layers are formed on the dummy gate, the sacrificial oxide layers removed before deposition of the HKMG.

7. The method of claim 1, wherein the ReRAM includes a first conducting layer and a second conducting layer.

8. The method of claim 7, wherein the first conducting layer is hafnium oxide (HfOx) and the second material is titanium nitride (TiN).

9. A method for integrating a resistive random access memory (ReRAM) device with vertical transistors on a single chip, the method comprising:
 forming a vertical field effect transistor (FET) including an epitaxial tip defining a drain terminal; and
 forming the ReRAM device covering a portion of the epitaxial tip of the vertical FET such that a current conducting filament is formed at the epitaxial tip due to electric field enhancement.

10. The method of claim 9, wherein the vertical FET and the ReRAM are connected in series.

11. The method of claim 9, wherein the ReRAM includes a first conducting layer and a second conducting layer.

12. The method of claim 11, wherein the first conducting layer is hafnium oxide (HfOx) and the second material is titanium nitride (TiN).

13. A semiconductor structure, comprising:
 a vertical transistor including an epitaxial tip defining a drain terminal; and
 a resistive memory element formed directly on the epitaxial tip of the vertical transistor;
 wherein a high-k metal gate is formed in direct contact with sidewalls of the vertical transistor.

14. The structure of claim 13, wherein the resistive memory element includes a resistive random access memory (ReRAM).

15. The structure of claim 13, wherein a current conducting filament is formed at the epitaxial tip due to electric field enhancement.

16. The structure of claim 13, wherein the resistive memory element and the drain terminal are connected in series.

17. The structure of claim 13, wherein the resistive memory element includes a first conducting layer and a second conducting layer.

18. The structure of claim 17, wherein the first conducting layer is hafnium oxide (HfOx) and the second material is titanium nitride (TiN).

19. The structure of claim 13, wherein the epitaxial tip defining the drain terminal is aligned with the vertical transistor and the high-k metal gate.

* * * * *